(12) United States Patent
Hsieh et al.

(10) Patent No.: US 7,724,321 B2
(45) Date of Patent: May 25, 2010

(54) LIQUID CRYSTAL DISPLAY

(75) Inventors: Min-Hsun Hsieh, Hsinchu (TW);
Chien-Yuan Wang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 1264 days.

(21) Appl. No.: 11/233,039

(22) Filed: Sep. 23, 2005

(65) Prior Publication Data
US 2006/0065900 A1    Mar. 30, 2006

(30) Foreign Application Priority Data

| Sep. 24, 2004 | (TW) | ............................... 93129157 A |
| Feb. 4, 2005 | (TW) | ............................... 94103538 A |
| May 6, 2005 | (TW) | ............................... 94114630 A |
| Jun. 29, 2005 | (TW) | ............................... 94121784 A |
| Aug. 22, 2005 | (TW) | ............................... 94128643 A |

(51) Int. Cl.
*G02F 1/1335* (2006.01)
*G02F 1/13357* (2006.01)

(52) U.S. Cl. ............................... 349/68; 349/62; 349/71; 349/106; 349/113; 362/97.3

(58) Field of Classification Search .................. 349/61, 349/62, 64, 68, 71, 106, 108, 113; 362/84, 362/97.2, 97.3, 231, 249.02; 257/79, 88, 257/89

See application file for complete search history.

(56) References Cited

U.S. PATENT DOCUMENTS

| 6,252,254 | B1 | 6/2001 | Soules et al. |
| 6,255,670 | B1 | 7/2001 | Srivastava et al. |
| 6,278,135 | B1 | 8/2001 | Srivastava et al. |
| 6,294,800 | B1 | 9/2001 | Duggal et al. |
| 6,679,621 | B2 | 1/2004 | West et al. |
| 6,686,691 | B1 | 2/2004 | Mueller et al. |
| 6,791,636 | B2 | 9/2004 | Paolini et al. |
| 6,809,781 | B2 | 10/2004 | Setlur et al. |
| 6,844,903 | B2 | 1/2005 | Mueller-Mach et al. |
| 2004/0004988 | A1* | 1/2004 | Cok et al. ........................ 372/70 |
| 2004/0061810 | A1 | 4/2004 | Lowery et al. |
| 2004/0218390 | A1* | 11/2004 | Holman et al. ............... 362/245 |
| 2005/0001537 | A1 | 1/2005 | West et al. |
| 2005/0073495 | A1* | 4/2005 | Harbers et al. ............... 345/102 |

FOREIGN PATENT DOCUMENTS

| JP | 06-242726 | 9/1994 |
| JP | 2003-40616 | 2/2003 |
| TW | 528910 | 4/2003 |

* cited by examiner

*Primary Examiner*—Dung Nguyen
*Assistant Examiner*—Tai Duong
(74) *Attorney, Agent, or Firm*—Rabin & Berdo, PC

(57) ABSTRACT

A liquid crystal display having a backlight module, liquid crystal layer and a color filter layer is disclosed in the invention. An ultraviolet unit for emitting ultraviolet is disposed in the backlight module. The color filter layer is composed of a purity of pixels, and at least one of the purity of pixels is filled with a wavelength-converting material. The wavelength-converting material can convert ultraviolet into green light.

18 Claims, 5 Drawing Sheets

LIQUID CRYSTAL DISPLAY

RELATED APPLICATIONS

The present application claims the right of priority based on Taiwan Application Serial Number 093129157, filed Sep. 24, 2004; Taiwan Application Serial Number 094103538, filed Feb. 4, 2005; Taiwan Application Serial Number 094114630, filed May 6, 2005; Taiwan Application Serial Number 094121784, filed Jun. 29, 2005; and Taiwan Application Serial Number 094128643, filed Aug. 22, 2005, the disclosure of which is incorporated herein by reference in their entirety.

FIELD OF THE INVENTION

The present invention relates to a liquid crystal display (LCD) comprising a color filter layer and a backlight module, the backlight module comprising an ultraviolet unit, the color filter layer comprising a wavelength-converting material able to absorb the ultraviolet light emitted from the ultraviolet unit and emit green light.

BACKGROUND OF THE INVENTION

A liquid crystal display belongs to a non-self emitting display, and thus light emitting device is needed to act as a light source. Such a light emitting device is generally called a backlight module. Backlight modules are commonly divided into two types: a direct-light type and an edge-light type. The conventional backlight module uses a lamp tube such as a cold cathode florescent lamp (CCFL) as a light source. However, the CCFL fails to regenerate the real colors of objects due to the low color rendering index (CRI).

For better color rendering, a light-emitting diode (LED) is deemed a better solution for the light source of backlight module in the coming market. LEDs offer benefits such as small size, low power consumption, fast response time, long operating time, and durability, etc. A color filter is usually used in the LCD for separating the three primary colors, i.e. red, blue and green from the white light. Mixing the three primary colors in different percentages may create various desired colors.

There are several methods of forming white light by LEDs. (1) A blue LED used with a yellow phosphor, commonly yttrium-aluminum-garnet (YAG) phosphor, is one of the most popular measures forming white light. However, this type of white light is formed by mixing blue light with yellow light, and the spectrum thereof is mainly shown at two wavelengths of 460 nm and 550 nm, i.e. this type of while light lacks of red and green lights, and thus a LCD adopting this type of white light fails to show real color of object. (2) A blue LED is used to excite the red and green phosphors for generating red and green lights. The red light, the green light, and the blue are mixed to form white light. However, there is serious crosstalk among the red, blue and green colors generated by this method, i.e. the bandwidths of the red, blue and green colors are overlapped (3) A ultraviolet LED is used to excite three or more phosphors for generating three colors of red, blue and green. This method also causes serious crosstalk. (4) Three separate red, blue and green LEDs are used to generate white light. The white light made by this method can achieve NTSC 105% or more, which is 1.5 times higher than the conventional CCFL. However, due to the different illumination efficiencies of different colors LEDs, different numbers of the red, blue and green LEDs are required for practical application. Generally speaking, the efficiency of green LED is poorer, and thus more green LEDs are needed to balance with the light amount generated from other colored LEDs. However, the more LEDs the higher cost rises, and more space needs for accommodating the LEDs.

SUMMARY OF THE INVENTION

A liquid crystal display (LCD) of the present invention comprises a backlight module including an ultraviolet unit; a liquid crystal layer used for controlling light flux emitted from the backlight module; and a color filter layer comprising a plurality of pixels and a wavelength-converting material formed on one of the pixels, wherein the wavelength-converting material emits green light after being irradiated by the ultraviolet unit.

The backlight module further comprises a red-light unit and a blue-light unit, and preferably, at least one of the ultraviolet unit, the red-light unit and the blue-light unit is a light-emitting diode (LED).

The filter layer preferably has a reflection layer used for reflecting the specific light from the backlight module. Preferably, the color filter layer comprises a distributed bragg reflector (DBR) used for reflecting the light from the backlight module.

BRIEF DESCRIPTION OF THE DRAWINGS

The foregoing aspects and some attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

First Embodiment

Figure 1:
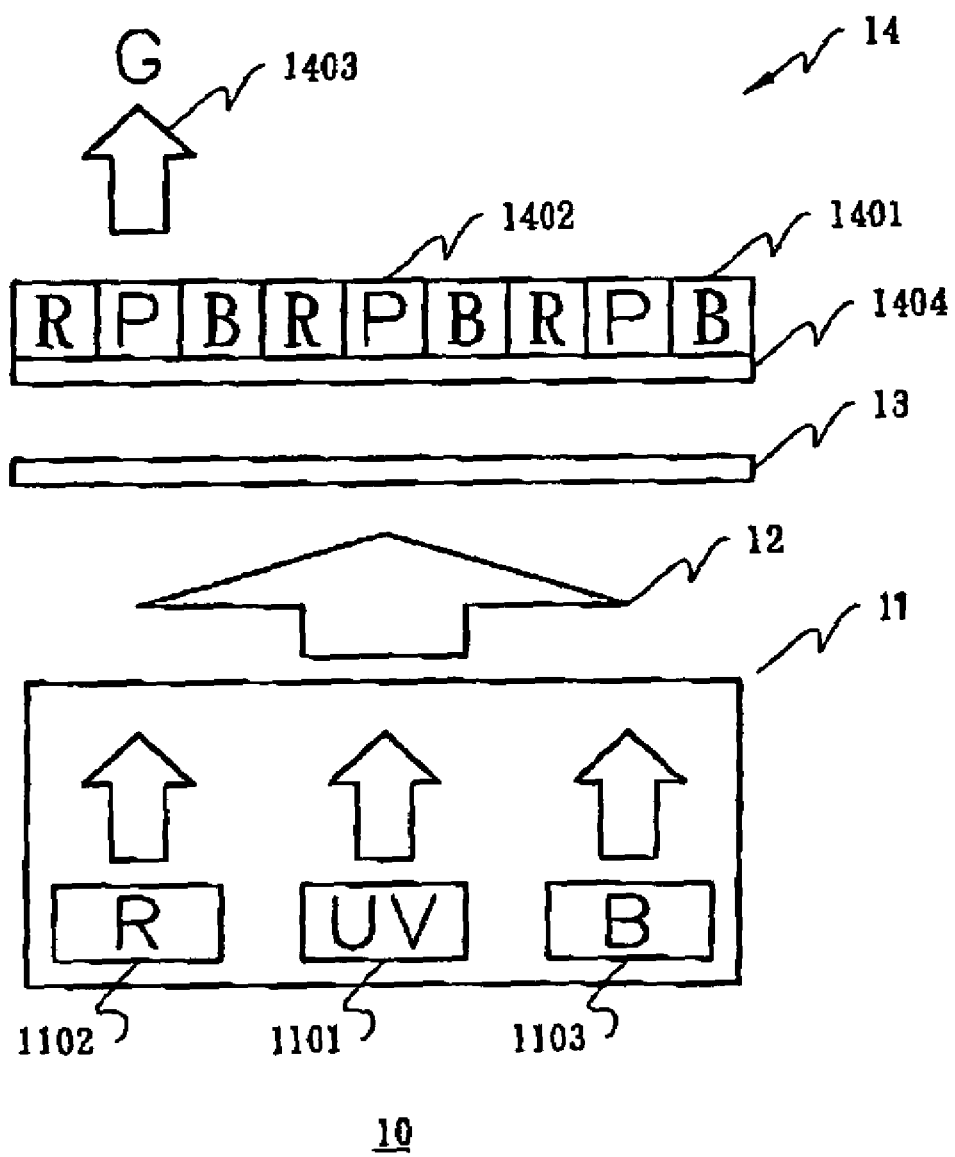
FIG. 1 is a schematic diagram illustrating an embodiment of the present invention.

FIG. 1 is a schematic diagram illustrating the structure of a LCD 10 of the present invention. Some components of the LCD 10 are omitted for clarity in FIG. 1.

The LCD 10 comprises a backlight module 11 acting as a light source to the LCD 10. Since the LCD 10 shows the image displayed in the visible wavelength range to a user, the backlight module 11 generally has to a light source in the visible wavelength range. The backlight module 11 generally has to provide white light, and the white light is preferably generated by the three primary colored light emitted from red, blue and green LEDs.

To increase the illumination efficiency of green light, the backlight module 11 of the present invention uses an ultraviolet emitter, such as an ultraviolet unit 1101, preferably, an ultraviolet LED, and a wavelength-converting material 1402 (labeled as P) which can absorb ultraviolet light to generate green light. The wavelength of the ultraviolet light herein is between 10 nm-420 nm, and preferably between 200 nm-420 nm. White light can be formed by mixing red light emitted from a red-light unit 1102, blue light emitted from a blue-light unit 1103, and green light emitted from the wavelength-converting material 1402 radiated by the ultraviolet unit 1101. The red-light unit 1102 and the blue-light unit 1103 includes by not limited to LEDs, florescent lamps, incandescent lamps and halogen lamps.

The wavelength-converting material 1402 is such as a phosphor able to being excited by the ultraviolet light emitted from the ultraviolet unit 1101 to generate green light. If the wavelength of the ultraviolet light from the ultraviolet unit 1101 ranges between 200 nm and 420 nm, preferably between 360 nm and 400 nm, the wavelength-converting material 1402 can use an alkaline earth metal silicate phosphor, and preferably an europium(Eu) activated alkaline earth metal silicate phosphor. The composition of the europium(Eu) activated alkaline earth metal silicate phosphor is $(SrBaMg)_2SiO_4:Eu$. The FWHM (Full Width Half Maximum) of the light generated by such a phosphor is smaller than 35 nm and that of green light emitted by InGaN LEDs. The europium (Eu) activated alkaline earth metal silicate phosphor is available from the commercial products fabricated by Intematix Corporation, CA., USA, such as G400™/G380™/G360™ series.

Other phosphors that can be excited by UV light and emits green light is such as $(Ba_{1-x-y-z}Ca_xSr_yEu_z)_2(Mg_{1-w}Zn_w)Si_2O_7$, wherein $x+y+z=1$, $0.05 > z > 0$ and $w > 0.05$; $Ca_8Mg(SiO_4)_4Cl_2:Eu,Mn$; $Ba_2SiO_4:Eu$; $Ba_2MgSi_2O_7:Eu$; $BaAl_2O_4:Eu$; $SrAl_2O_4:Eu$; and $BaMg_2Al_{16}O_{27}:Eu$, etc., wherein the excited wavelength thereof is 330 nm-420 nm.

The numbers of the ultraviolet unit 1101, the red-light unit 1102 and the blue-light unit 1103 depends on the factors including but not limited to the size of the LCD 10, the brightness required by the LCD 10, the lighting intensity of each of the units 1101, 1102 and 1103, and the optical design inside the backlight module 11. The red, blue, and green (violet) LEDs can be arranged in a sequence including red-blue-green (violet), red-green (violet)-blue, blue-green (violet)-red, blue-red-green (violet), green (violet)-red-blue, green (violet)-blue-red, red-blue-green (violet)-red and red-green (violet)-blue-red.

In the present embodiment, since the ultraviolet light is invisible to human eyes, the mixture light 12 emitted from the backlight module 11 merely shows the light formed by mixing the red light with the blue light, i.e. the light in purple-red series.

A liquid crystal layer 13 comprises a liquid crystal material and a thin film transistor (TFT) layer. When a bias is applied to the TFT layer, the liquid crystal molecules will be tilted or rotated and accordingly the light flux of the mixture light 12 passing through the liquid crystal layer changed.

The mixture light 12 passes through the liquid crystal layer 13 and reaches a color filter layer 14. The color filter layer 14 generally is formed on a glass substrate and comprises a plurality of pixels 1401 (labeled as R, P, B in FIG. 1). A pixel set is usually formed by at least three single color pixels for separating red, blue, and green light from the mixture light 12.

In the present embodiment, the wavelength-converting material 1402 is disposed inside one pixel (hereinafter is called a green pixel P) in one pixel set. The wavelength-converting material 1402 is excited by the ultraviolet light emitted from the ultraviolet unit 1101 and generates green light (G). The other two pixels in one pixel set are a red pixel (R) and a blue pixel (B). The red and blue pixels may be formed by organic material. The red pixel (R) permits only the red light of the mixture light 12 passing, while the blue pixel (B) permits only the blue light of the mixture light 12 passing. Consequently, the red pixel (R) displays red color, and the blue pixel (B) displays blue color.

Besides organic materials, the red pixel (R) and the blue pixel (B) also can be formed from the phosphors that can be excited by UV light to emit red light and blue light. The phosphors that can be excited by UV light to emit red light are such as $Y_2O_2S:Eu,Bi$; $Y_2O_3S:Eu,Bi$; and $3.5MgO\cdot0.5MgF_2\cdot GeO_2:Mn^{+4}$, wherein the excited wavelength thereof is 330 nm-420 nm. The phosphors that can be excited by UV light to emit blue light are such as $BaMg_2Al_{16}O_{27}:Eu$; $(SaBaCa)_5(PO_4)_3Cl:Eu$; and $Sr_4Al_{14}O_{25}:Eu$, wherein the excited wavelength thereof is 220 nm-330 nm.

Each of the pixels permits only a portion of white light passing, in other hand, the amount of light passing exiting the pixels is less than that entering the pixels due to the other portion of light being absorbed by the pixels, and accordingly light-output efficiency decreases. In order to raise the light-output efficiency, a DBR 1404 is formed in front of the filtering layer 1401 for reflecting the light in a selected wavelength. For example, in front of the red pixel (R), a DBR layer that can reflect blue light or ultraviolet light is formed for preventing the blue light or the ultraviolet light from being absorbed by the red pixel (R) and reflecting the blue light or the ultraviolet light so as to enter the blue pixel (B) or the green pixel (P). As to the other pixels, the corresponding DBRs may be used. Besides, since ultraviolet light is reflected by the DBR 1404, the ultraviolet light can be prevented from emitting the LCD 10.

Further, the LCD 10 may also comprise other optical films, such as a prism sheet, a diffuser and a polarizer, etc., wherein the prism sheet and the diffuser is generally disposed in the backlight module 11 for unifying the light emitted from the light-emitting units 1101-1103 so as to generate the desired mixture light 12. The polarizer is generally used with the liquid crystal layer 13, so that the mixture light 12 is polarized before entering the liquid crystal 13.

Although the method of using ultraviolet light to excite the wavelength-converting material 1402 for generating green light can increase the green light output efficiency, yet some components inside the LCD 10, particularly the plastic components such as the prism sheet, the diffuser and the polarizer, etc., are easily deteriorated due to ultraviolet irradiation. Hence those optical films or plastic components are preferably made of ultraviolet resistant material.

Other technical references related to the present invention, such as US2005/0001537A1, US2004/0061810A1, U.S. Pat. No. 6,686,691, U.S. Pat. No. 6,791,636, U.S. 6,844,903, U.S. Pat. No. 6,809,781, U.S. Pat. No. 6,252,254, U.S. Pat. No. 6,255,670, U.S. Pat. No. 6,278,135, U.S. Pat. No. 6,294,800, EP1138747, WO0189000 and WO0189001, are listed herein for reference.

Second Embodiment

Figure 2A:
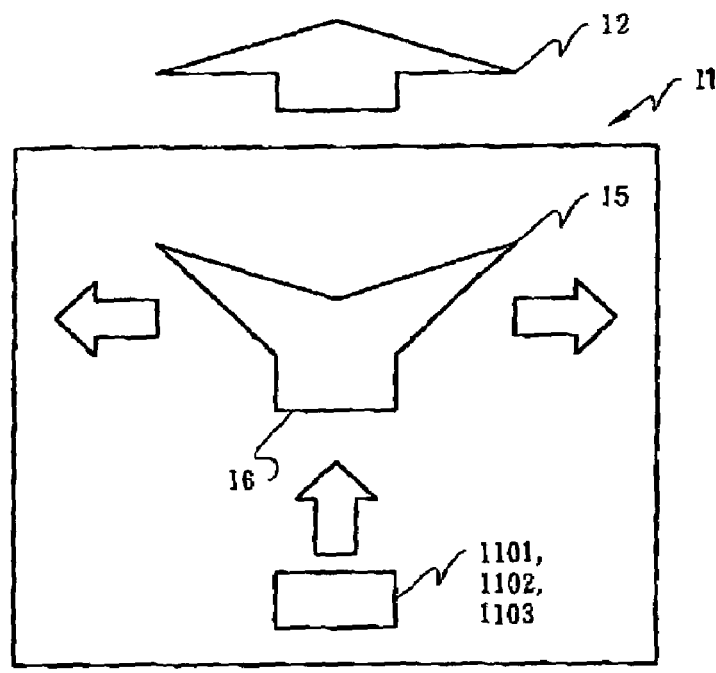
FIGS. 2a to 2e are schematic diagrams respectively illustrating a light-spreading device and an optically-conditioning surface in accordance with the embodiment of the present invention.

The backlight module disclosed in the present embodiment comprises a light-spreading device 15 and/or an optically-conditioning surface 16 having a wavelike array for guiding, mixing and/or spreading the light generated from each of the light-emitting units 1101-1103 towards the liquid crystal layer 13, such as shown in FIG. 2a.

Figure 2B:
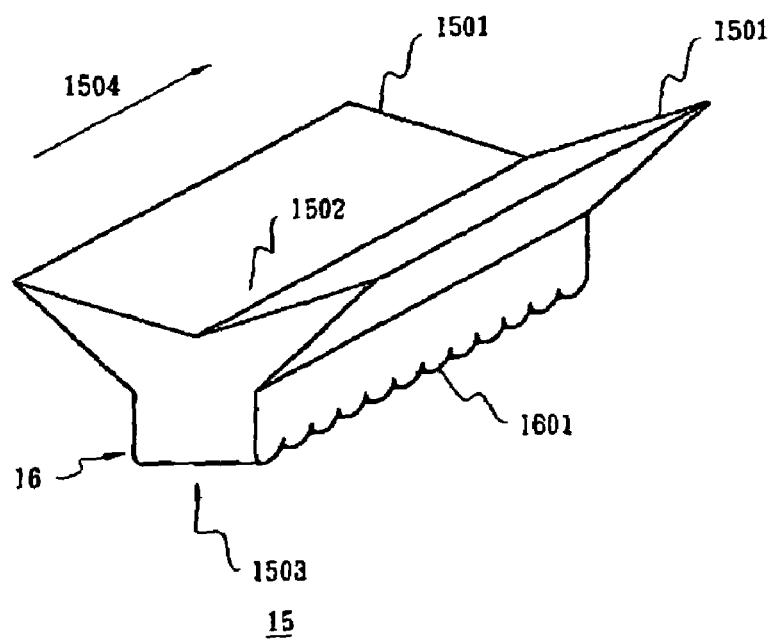

Such as shown in FIG. 2b, the light-spreading device 15 has a wing-shaped protrusion part 1501, a recess 1502 and a light-entering surface 1503. The light-spreading device 15 is formed in a longitudinal direction 1504. The recess 1502 is located away from the light-entering surface 1503, and preferably is located on the side opposite to the light-entering surface 1503. A first wavelike array 1601 is formed on the light-conditioning surface 16 for diffusing and/or mixing the light emitted from the ultraviolet unit 1101, the red-light unit 1102 and/or the blue unit 1103, thereby preventing the backlight module 11 from generating light spots or showing unmixed colored light. A portion of the light passing through the light-entering surface 1503 of the light-spreading device 15 is total-internal-reflected on the recess 1502 to both sides thereof, i.e. to the wing-shaped protrusion part 1501, and another portion of the light passing through the recess 1502 may be refracted in compliance with the Snell's law due to the difference of the refractive indexes between the light-spreading device 15 and the ambient optical medium. Since a portion of the light is total-internal-reflected in the recess 1502 and directed to the wing-shaped protrusion part 1501, the light flux emitting from the recess 1502 is reduced. Preferably, the shape of the recess 1502 is similar to a V-shape or U-shape. The light inside wing-shaped protrusion part 1501 may be refracted, reflected or directly exit out of the light-spreading device 15. For example, the light entering the light-spreading device 15 at a specific angle will be gradually mixed as uniform colored light after several times of total reflection inside the wing-shaped protrusion part 1501. The light-entering surface 1503 is not limited to a planar surface, but also can be a concave shape or other shapes able to receive light.

A first wavelike array 1601 may be formed on the optically-conditioning surface 16, and both of the optically-conditioning surface 16 and the first wavelike array 1601 may be formed on the light-entering surface 1503 of the light-entering surface 1503. The first wavelike array 1601 is a wave-shaped surface. The wave-shaped surface has a wave propagation direction, i.e. the array direction or wavefront direction of the first wavelike array 1601. The wave structures formed on the first wavelike array 1601 may be a plurality of micro-lenses. Light through the micro-lenses is blurred. The diameter of each micro-lens is about 50-60 μm. If the waves of the first wavelike array 1601 are constructed consecutively, a distance between two consecutive wave peaks or troughs is about between 100 μm and 120 μm.

Figure 2C:
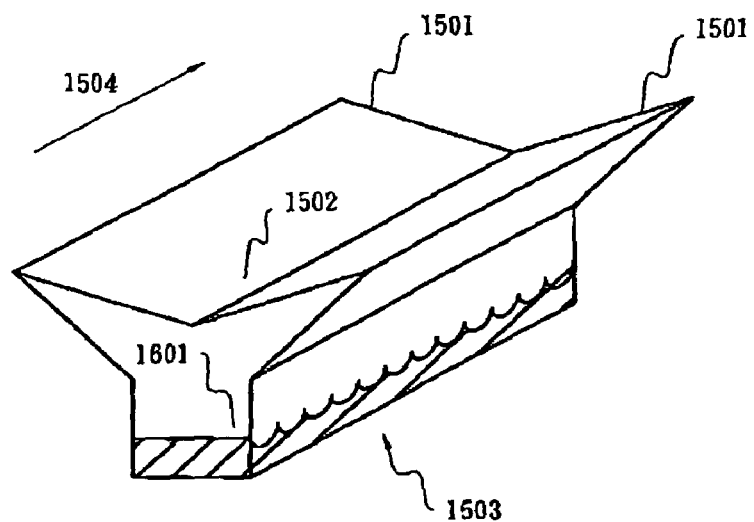

The optically-conditioning surface 16 may optionally be formed inside the light-spreading device 15 by combining two light-pervious materials with different refractive indexes. The wavelike array is then formed on the interface of the two light-pervious materials, such as shown in FIG. 2c. The hatched portion has a material different from the other portion's. The first wavelike array 1601 is not limited to being disposed on the light-entering surface 1503, but also can be disposed on the wing-shaped protrusion part 1501 or/and the recess 1502, such as shown in FIG. 2e.

The material forming the light-spreading device 15 is such as acrylic resin, cyclo-olefin co-polymer (COC), polymethylmethacrylate (PMMA), polycarbonate (PC), polyetherimide, fluorocarbon polymer, silicone, the combinations thereof, or other light-pervious material.

Figure 2D:
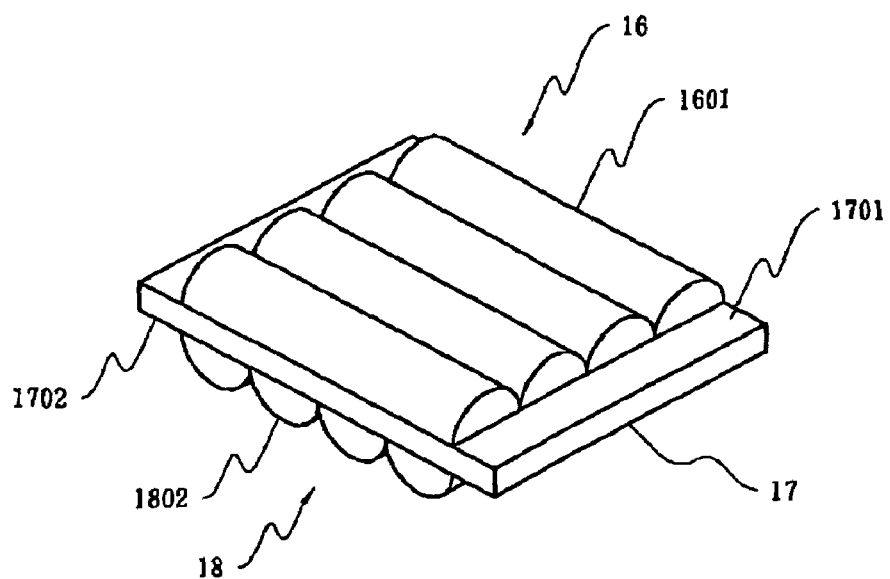
Figure 2E:
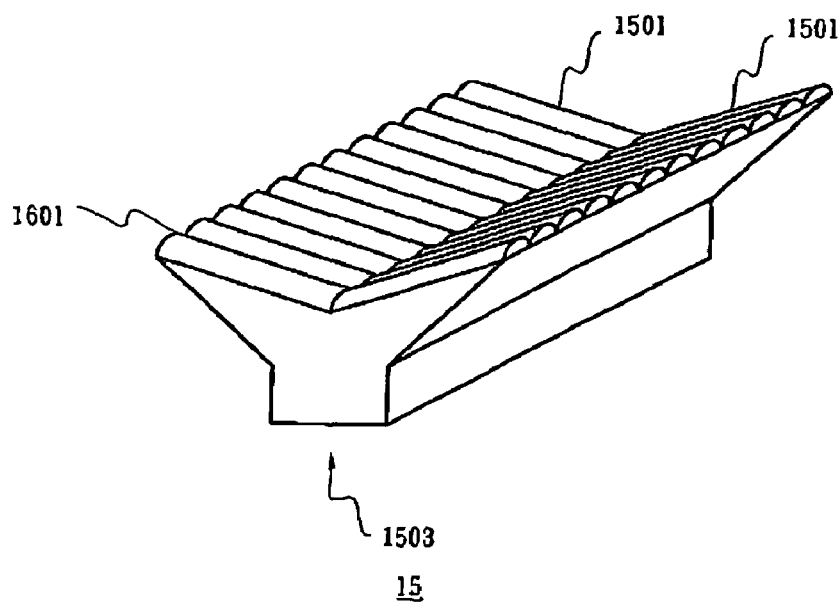

As shown in FIG. 2d, the optically-conditioning surface 16 may also be formed on an optical film 17 having a first surface 1701 and a second surface 1702 opposite to the first surface 1701. The optically-conditioning surface 16 is formed on one of the first surface 1701 and the second surface 1702. If the optically-conditioning surface 16 is formed on the first surface 1701, the first wavelike array 1601 is then formed on the first surface 1701. The optical film 17 can be installed above the light-spreading device 15 or the area between the light-spreading device 15 and the light-emitting units 1101-1103. Further, a second optically-conditioning surface 18 can be formed on the second surface 1702, and a second wavelike array 1801 is formed on the second optically-conditioning surface 18. The array direction of the second wavelike array 1801 is different from that of the first wavelike array 1601. In that case, a Moiré pattern can be formed by stacking the first wavelike array 1601 and the second wavelike array 1801 having different array directions. By properly adjusting the first wavelike array 1601 and the second wavelike array 1801, the intensity of the light passing through the Moiré pattern can be re-distributed, thereby achieving the performance of scattering the light uniformly. The optical film 17 may be available from the product manufactured by S-Light Opt Electronics Inc., Taiwan.

The optically-conditioning surface 16 or 18 is not limited to being merely disposed on one of the light-spreading device 15 and the optical film 17, but also can be formed on both of the light-spreading device 15 and the optical film 17. The first wavelike array 1601 and the second wavelike array 1801 can have the same or different wave sizes, wave shapes and wave frequencies.

If the arrangement direction of the light-emitting units 1101, 1102 and/or 1103 is parallel to the array direction of the first wavelike array 1601, i.e. to the wavefront direction thereof, a light pattern substantially parallel to the wavefont direction of the first wavelike array 1601 will be generated after the light passes through the first wavelike array 1601. When the arrangement direction of the light sources 1101, 1102 and/or 1103 and the wavefront direction of the first wavelike array 1601 are formed in straight lines, the light will be distributed as straight lines; when the arrangement direction of the light sources 1101, 1102 and/or 1103 and the wavefront direction of the first wavelike array 1601 are formed in curved or radiating patterns, the light will be distributed as curved or radiating patterns. Theoretically, when the arrangement direction of the light sources 1101, 1102 and/or 103 is parallel or about parallel to the wavefront direction of the first wavelike array 1601, the light emitted from the light sources 1101, 1102 and/or 1103 is distributed into the light pattern extending along the wavefront direction.

The detailed techniques of the light-spreading device and the wavelike array have been described in Taiwan Application Serial Number 093129157 and Taiwan Application Serial Number 094114630, which are listed herein for reference.

Third Embodiment

Figure 3A:
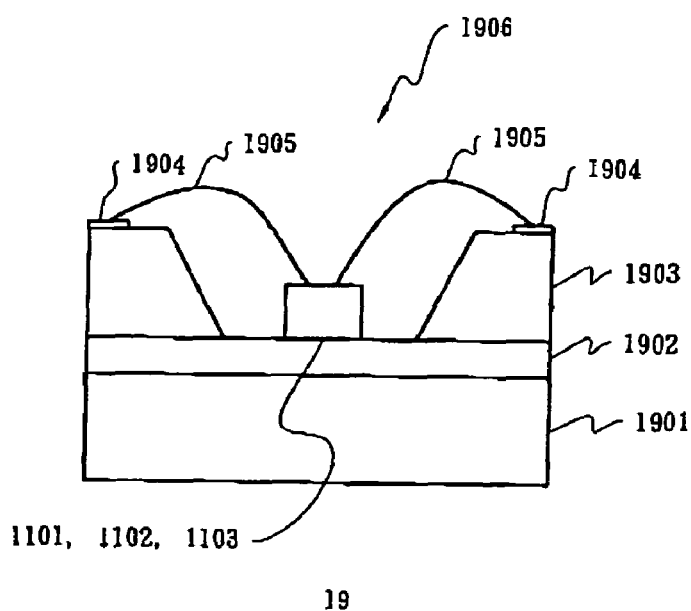
FIGS. 3a and 3b are schematic diagrams illustrating the compositions of a semiconductor light-emitting element assembly in accordance with the embodiment of the present invention.

In the present embodiment, the light-emitting units are semiconductor light-emitting elements, such as LEDs, and preferably LED dies. With the power increasing, the heat generated from LEDs also increases accordingly. For providing heat dissipation for the LEDs, the present invention installs the ultraviolet unit 1101, the red-light unit 1102 and/or the blue-light unit 1103 on a composite substrate 1901, such as shown FIG. 3a. 19 indicates a semiconductor light-emitting element assembly, such as a LED package; 1901 indicates a composite substrate; 1902 indicates a connecting structure; 1903 indicates a circuit layout carrier; 1904 indicates an electrical contact; and 1905 indicates a conductive wire.

The circuit layout carrier 1903 is bonded to a composite substrate 1901 through a connecting structure 1902. The ultraviolet unit 1101, the red-light unit 1102 and/or the blue-light unit 1103 are fixed in a recess 1906. Conductive wires 1905 or other electrically connecting means are used to connect the ultraviolet unit 1101, the red-light unit 1102 and/or the blue-light unit 1103 to electrical contacts 1904 formed on the circuit layout carrier 1903. The difference between the thermal expansion coefficient of the light-emitting units 1101-1103 and that of the composite substrate 1901 is approximately smaller than or equal to $10 \times 10^{-6}/°$ C., thus the thermal stress between the light-emitting units 1101-1103 and the composite substrate 1901 is reduced.

The thermal expansion coefficient of the LED die generally is between $1 \times 10^{-6}/°$ C. and $10 \times 10^{-6}/°$ C. For example, the thermal expansion coefficient of GaN is about $5.4 \times 10^{-6}/°$ C.; that of InP is about $4.6 \times 10^{-6}/°$ C.; that of GaP is about $5.3 \times 10^{-6}/°$ C. In order to decrease excessive thermal stress formed between the light-emitting units 1101-1103 and its contact material, a composite substrate 1901 is used as the supporting base of the semiconductor light-emitting element assembly 19. Besides, the composite substrate 1901 is also used as a heat-dissipation media. The thermal expansion coefficient of the composite substrate 1901 is preferably smaller than or equal to $10 \times 10^{-6}/°$ C.

The composite material is usually formed from two or more materials, and these two or more materials do not form any other molecular or atomic structures. Generally speaking, the composite material can offer the benefits of the separate materials and has physical properties better than that of the original materials. The composite material usually has the benefits of lightweight, high strength, and good thermal properties etc. The composite material includes a metal matrix composite (MMC), a polymer matrix composite (PMC), and ceramic matrix composite (CMC). These composites are respectively formed by mixing carbon fibers or ceramic fibers with metals, polymers, and ceramics. The composite substrate 1901 preferably formed by the metal matrix composite with a thermal conductivity coefficient not smaller than 150 W/mK and a thermal expansion coefficient not greater than $10 \times 10^{-6}/°$ C., such as aluminum matrix composite (its thermal conductivity coefficient is about 100~640 W/mK; and its thermal expansion coefficient of the composite substrate is about $5 \sim 10 \times 10^{-6}/°$ C.). Nonetheless, a polymer matrix composite and ceramic matrix composite may also be used as the composite substrate 1901.

The circuit layout carrier 1903 is, for example, a printed circuit board, a flexible printed circuit, a semiconductor substrate such as a Si substrate or a ceramic substrate, etc. The semiconductor substrate used as the circuit layer carrier 1903 can use various semiconductor processes such as etching, sputtering etc. to form the desired circuits thereon, and also can be integrated with the process for forming the semiconductor light-emitting diode. The semiconductor substrate such as the Si substrate has acceptable heat transfer properties (its thermal conductivity coefficient and thermal expansion coefficient are about 150 W/mK and $4 \times 10^{-6}/°$ C. respectively). Since the thermal conductivity coefficients and thermal expansion coefficients of a metal matrix composite substrate are close to those of s Si substrate, the thermal stress between the two kinds of materials can be effectively reduced and the conductive efficiency can be further improved. Nonetheless, the printed circuit board or the flexible printed circuit may also be used.

The circuit layout carrier 1903 is bonded to the composite substrate 1901 through the connecting structure 1902. The connecting structure 1902 is made of adhesive material, preferably a flexible adhesive layer. The flexible adhesive layer preferably preserves adhesion at a room temperature or a medium low temperature. The material forming the flexible adhesive layer includes but not limited to benzocyclobutene (BCB), epoxy, polyimide, SOG (Spin On Glass), silicone, solder, equivalents thereof and combinations thereof. Those flexible adhesive materials can be cured at a relatively low temperature (commonly smaller than 300° C.), thereby reducing the thermal stress between the composite substrate 1901 and the light-emitting units 1101-1103 and/or between the composite substrate 1901 and the circuit layout carrier 1903 at high temperature, also lessening the damage to the light-emitting units 1101-1103 at high temperature.

Figure 3B:
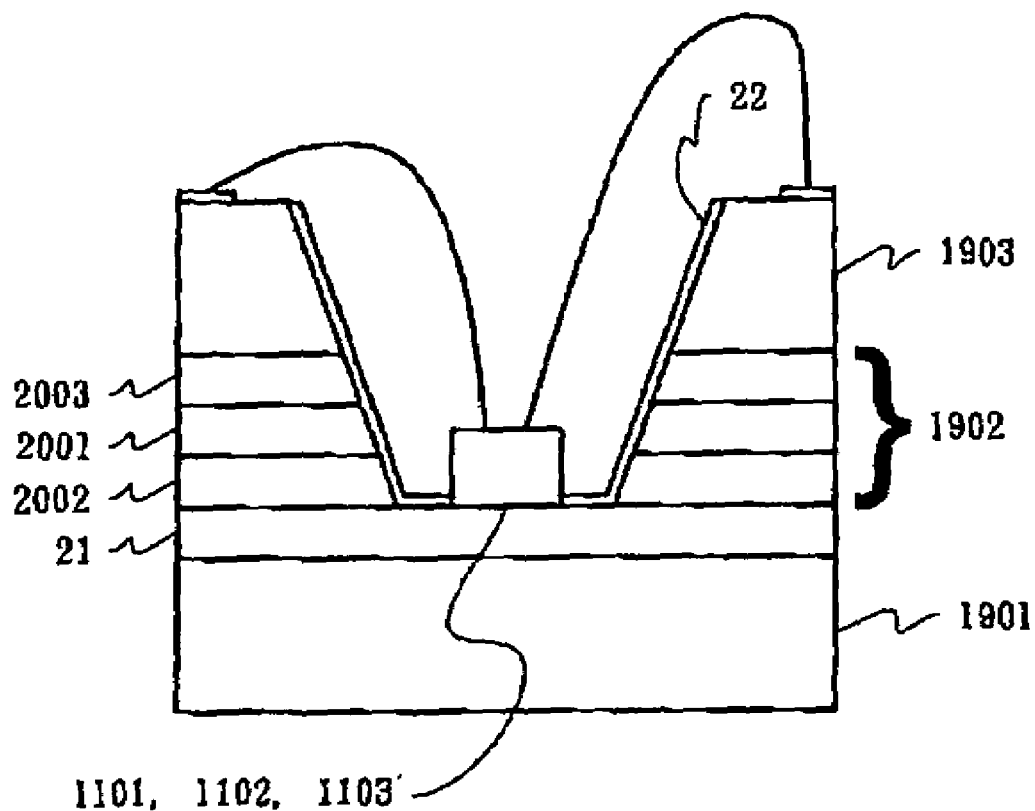

As shown in FIG. 3b, the connecting structure 1902 is composed of a flexible adhesive layer 2001, and a reaction layer 2002 and/or a reaction layer 2003. The flexible adhesive layer 2001 can be formed by the material described above. The reaction layers 2002 and 2003 are formed respectively between the flexible adhesive layer 2001 and the circuit layout carrier 1903; and/or between the flexible adhesive layer 2001 and the composite substrate 1901, for enhancing the adhesion between the flexible adhesive layer 2001 and the circuit layout carrier 1903 and/or the composite substrate 1901. The material forming the reaction layers 2002 and 2003 includes but not limited to silicon nitride ($SiN_x$), epoxy, titanium (Ti), chromium (Cr), or combinations thereof The reaction layer 2002 and/or the reaction layer 2003 can be formed on the circuit layout carrier 1903 and/or the composite substrate 1901 by the method of physical vapor deposition (PVD) or chemical vapor deposition (CVD). The flexible adhesive layer 2001 may be formed on one side of the circuit layout carrier 1903 and/or one side of the composite substrate 1901. The circuit layout carrier 1903 is bonded to the composite substrate 1901 at certain pressure and temperature, such as 328 g/cm$^2$-658 g/cm$^2$ and 150° C.-600° C., and preferably 505 g/cm$^2$ and 200° C.-300° C.

If the surface of The composite substrate 1901 is a rough surface, a planarizing layer 21 is formed on the surface of the composite substrate 1901 for flatting the rough surface of the composite substrate 1901 and improving the adhesion between the connecting structure 1902 and the composite substrate 1901. The material forming the planarizing layer 21 is such as nickel (Ni) or any other materials adhesible to the connecting structure 1902.

In the present embodiment, a wavelength-converting material 1402 covers the area above the light-emitting units 1101, 1102 and/or 1103. Furthermore, a light-pervious member, such as a lens, is capped the wavelength-converting material 1402 for securing and/or protecting the wavelength-converting material 1402.

The wavelength-converting material 1402 may be mixed with light-pervious material or other adhesive material and then is formed on the light-emitting units 1101, 1102 and/or 1103. Alternatively, the wavelength-converting material 1402 may also be formed over the area above the light-emitting units 1101, 1102 and/or 1103 by sedimentation without the mixture of the light-pervious material or any adhesive material.

A reflection layer 22 may be optionally formed inside the recess 1906 for reflecting and guiding the light emitted by the light-emitting units 1101-1103. The reflection layer 22 is formed by a light-reflection material, such as gold, silver, aluminum, and tin etc. The reaction layer 22 is formed on the partial or whole interior surface of the recess 1906 by using various known film deposition methods. Further, if the reflection layer 22 is electrical conductive, for keeping the insulation between the light-emitting units 1101-1103 and the reflection layer 22, the reflection layer 22 is preferably not formed on the area above the light-emitting units 1101-1103 covering the composite substrate 1901. In addition, for enabling the reflection layer 22 to achieve better reflection efficiency, the recess 1906 is formed in a tapered shape, i.e. the inner wall of the recess 1906 has a slope that forms a funnel-shaped volume inside the recess 1906.

The detailed techniques of the light-spreading device and the wavelike array have been described in Taiwan Application Serial Number 094103538, which is listed herein for reference.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A liquid crystal display, comprising:
    a backlight module comprising an ultraviolet unit, a red-light unit and a blue-light unit;
    a liquid crystal layer for controlling light flux emitted from the backlight module; and
    a color filter layer comprising a plurality of pixels and a wavelength-converting material formed on one of the pixels, wherein the wavelength-converting material emits green light after being irradiated by the ultraviolet unit.

2. The liquid crystal display of claim 1, wherein at least one of the ultraviolet unit, the red-light unit and the blue-light unit is a light-emitting diode.

3. The liquid crystal display of claim 1, wherein the pixels comprise a red pixel for passing through by red light, and a blue light pixel for passing through by blue light.

4. The liquid crystal display of claim 1, wherein the wavelength of the light emitted from the ultraviolet unit is between 200 nm and 420 nm.

5. The liquid crystal display of claim 1, wherein the color filter layer reflects the light from the backlight module.

6. The liquid crystal display of claim 1, wherein the color filter layer comprises a distributed bragg reflector (DBR) for reflecting the light from the backlight module.

7. The liquid crystal display of claim 1, wherein the liquid crystal layer comprises a thin film transistor (TFT) layer.

8. The liquid crystal display of claim 1, further comprising a plurality of optical films.

9. The liquid crystal display of claim 8, wherein one of the optical films is insensitive to ultraviolet.

10. The liquid crystal display of claim 8, wherein one of the optical films is selected from a group consisting of a prism sheet, a diffuser and a polarizer.

11. The liquid crystal display of claim 1, wherein the backlight module further comprises:
    a light-spreading device for directing the light inside the backlight module towards the liquid crystal layer.

12. The liquid crystal display of claim 1, wherein the backlight module further comprises:
    an optically-conditioning surface having a wavelike array.

13. The liquid crystal display of claim 1, wherein the wavelength-converting material comprises alkaline earth metal silicate.

14. The liquid crystal display of claim 1, wherein the wavelength-converting material comprises europium(Eu)-activated alkaline earth metal silicate.

15. The liquid crystal display of claim 1, wherein the wavelength-converting material is selected from a group consisting of $(SrBaMg)_2SiO_4$:Eu; $(Ba_{1-x-y-z}Ca_xSr_yEu_z)_2(Mg_{1-w}Zn_w)Si_2O_7$, wherein $x+y+z=1$, $0.05>z>0$ and $w<0.05$; $Ca_8Mg(SiO_4)_4Cl$:Eu,Mn; $Ba_2SiO_4$:Eu; $Ba_2MgSi_2O_7$:Eu; $BaAl_2O_4$:Eu; $SrAl_2O_4$:Eu; and $BaMg_2Al_{16}O_{27}$:Eu.

16. The liquid crystal display of claim 1, wherein the red-light unit and the blue-light unit comprise phosphors.

17. The liquid crystal display of claim 1, wherein the red-light unit comprises a material selected from a group consisting of $Y_2O_2S$:Eu,Bi; $Y_2O_3S$:Eu,Bi; and $3.5MgO_{0.5}MgF_2.GeO_2$:$Mn^{+4}$.

18. The liquid crystal display of claim 1, wherein the blue-light unit comprises a material selected from a group consisting of $BaMg_2Al_{16}O_{27}$:Eu;$(SaBaCa)_5(PO_4)_3Cl$:Eu; and $Sr_4Al_{14}O_{25}$:Eu.

* * * * *